(12) United States Patent
Luo

(10) Patent No.: US 6,711,018 B2
(45) Date of Patent: Mar. 23, 2004

(54) HEAT-DISSIPATING MODULE

(76) Inventor: Chin-Kuang Luo, 5F, No. 56, Min-Chuan Rd., Chung Dist., Taichung City (TW)

( * ) Notice: Subject to any disclaimer, the term of this patent is extended or adjusted under 35 U.S.C. 154(b) by 0 days.

(21) Appl. No.: 10/150,298

(22) Filed: May 17, 2002

(65) Prior Publication Data
US 2003/0103330 A1 Jun. 5, 2003

(30) Foreign Application Priority Data
Nov. 30, 2001 (TW) ........................................ 90129722 A

(51) Int. Cl.$^7$ ................................................. H05K 7/20
(52) U.S. Cl. ........................ 361/704; 62/3.2; 62/259.2; 165/80.3; 257/930
(58) Field of Search ........................ 361/688, 695–705, 361/709–712, 717–719; 257/706, 707, 712–715, 722, 930; 62/3.2, 3.3, 3.6, 3.61, 3.7, 259.2; 165/80.3, 185, 121–126, 104.33; 174/15.2, 16.3; 454/184

(56) References Cited
U.S. PATENT DOCUMENTS

| | | | | | |
|---|---|---|---|---|---|
| 4,224,980 | A | * | 9/1980 | Buchner | 165/275 |
| 4,722,026 | A | * | 1/1988 | Bennett et al. | 361/679 |
| 4,805,420 | A | * | 2/1989 | Porter et al. | 62/51.1 |
| 6,132,823 | A | | 10/2000 | Qu | 428/34.6 |
| 6,487,865 | B1 | * | 12/2002 | Luo | 62/3.61 |
| 6,557,352 | B2 | * | 5/2003 | Luo | 62/3.2 |

* cited by examiner

Primary Examiner—Gerald P. Tolin
(74) Attorney, Agent, or Firm—Trop, Pruner & Hu, P.C.

(57) ABSTRACT

In a heat-dissipating module for an electronic device, a heat-conducting unit is adapted to be disposed in close contact with a heat-generating component, and includes inner and outer tubes that cooperatively confine an enclosed chamber filled with a thermal superconductor material. A fan unit is disposed to generate currents of air through a chamber confined by the inner tube so as to dissipate the heat transferred to the heat-conducting unit from the heat-generating component. Alternatively, the heat-conducting unit can be configured into a tubular member, and a heat-dissipating unit is provided on the tubular member to help dissipate heat.

9 Claims, 8 Drawing Sheets

HEAT-DISSIPATING MODULE

BACKGROUND OF THE INVENTION

1. Field of the Invention

The invention relates to a heat-dissipating module, more particularly to a heat-dissipating module that can dissipate heat from a heat-generating electronic component in a highly efficient manner.

2. Description of the Related Art

FIG. 1 shows a conventional heat-dissipating device adapted to be mounted on top of a heat-generating component 12 that is disposed on a circuit board 11 of an electronic device. The heat-generating component 12 can be a central processing unit, an integrated circuit, or the like. The heat-dissipating device includes an aluminum heat-dissipating fin unit 13 disposed in close contact with the heat-generating component 12, and a fan 14 oriented toward the fin unit 13. The fin unit 13 has a bottom portion provided with a heat-conducting plate 15 that is formed from copper and that facilitates the transfer of heat generated by the-heat-generating component 12 to the fin unit 13. However, such a conventional heat-dissipating device has the following setbacks:

1. Although aluminum and copper have quite high temperature coefficients of conductivity, their combined heat-dissipating effect is not very satisfactory, resulting in that the surface temperature of the heat-generating component 12 remains higher than that of the fin unit 13. That is, currents of air blown from the fan 14 can only disperse the heat around the fin unit 13, and cannot reach the surface of the heat-generating component 12 to dissipate the heat around the heat-generating component 12.

2. In view of the aforesaid, when heat gradually accumulates on the surface of the heat-generating component 12, and the conventional heat-dissipating device cannot effectively dissipate the high heat, the operation of the heat-generating component 12 will be affected, which may result in shutdown of or even damage to the electronic device.

SUMMARY OF THE INVENTION

Therefore, the main object of the present invention is to provide a heat-dissipating module that can dissipate heat generated by a heat-generating component in a highly efficient manner so as to eliminate the aforesaid problems associated with the prior art.

According to one aspect of the invention, a heat-dissipating module includes:

a heat-conducting unit adapted to be disposed on a heat-generating component of an electronic device, the heat-conducting unit including a hollow inner tube that is made of a heat-conducting material and that confines a first chamber, and a hollow outer tube that is made of a heat-conducting material, that is disposed concentrically around the inner tube, and that cooperates with the inner tube to form a second chamber, the first chamber permitting passage of air therethrough, the second chamber having two closed ends and being filled with a thermal superconductor material, the outer tube having an outer planar surface adapted to be disposed in close contact with the heat-generating component so that heat generated by the heat-generating component is transferred to the heat-conducting unit; and a fan unit disposed to generate a current of air through the first chamber so as to carry away the heat transferred to the heat-conducting unit.

According to another aspect of the invention, a heat-dissipating module includes:

a heat-conducting unit adapted to be disposed on a heat-generating component of an electronic device, the heat-conducting unit including a hollow tubular member having inner and outer walls opposite to each other, the inner and outer walls confining an enclosed chamber that is filled with a thermal superconductor material; and a heat-dissipating unit disposed on the tubular member and including at least one of a metal plate, a heat-conducting pipe and a plurality of heat-dissipating fins.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
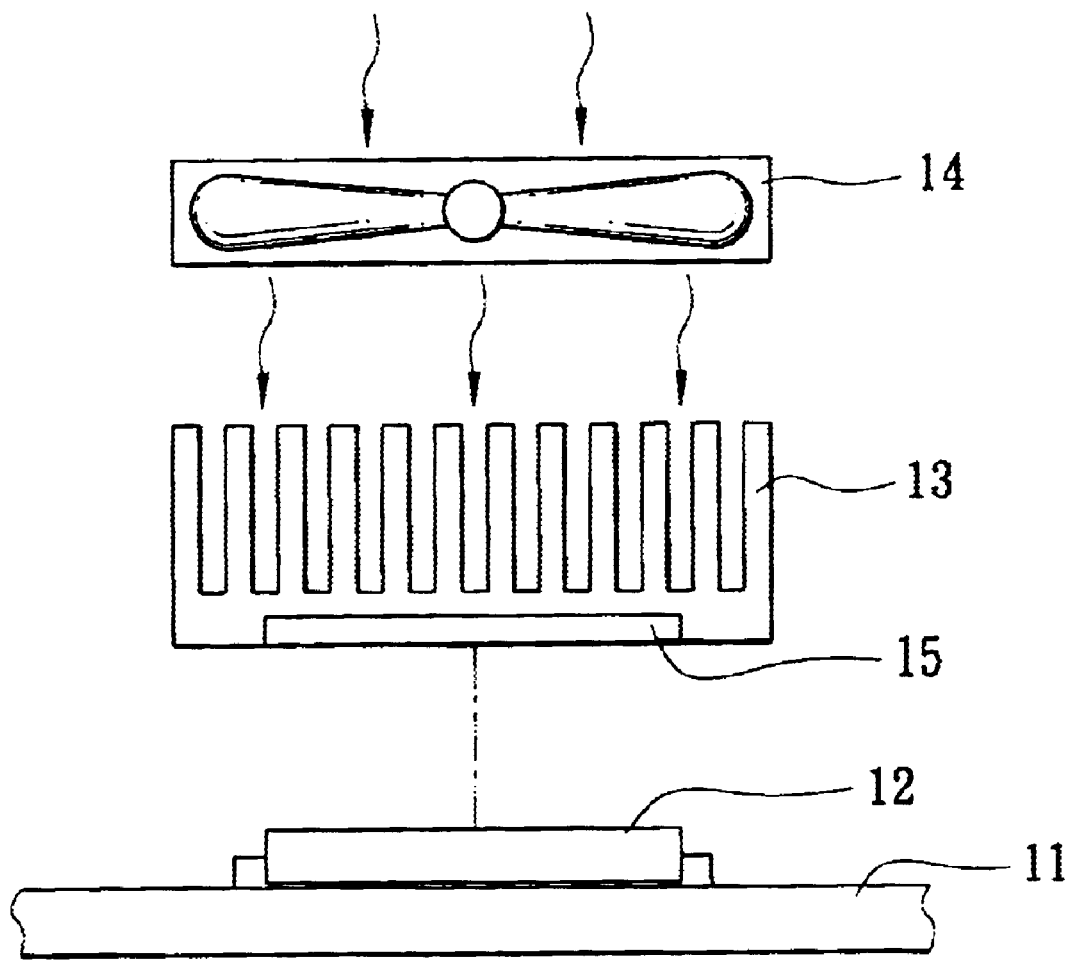
FIG. 1 is a schematic exploded view of a conventional heat-dissipating device.

Before the present invention is described in greater detail, it should be noted that like elements are denoted by the same reference numerals throughout the disclosure.

Figure 2:
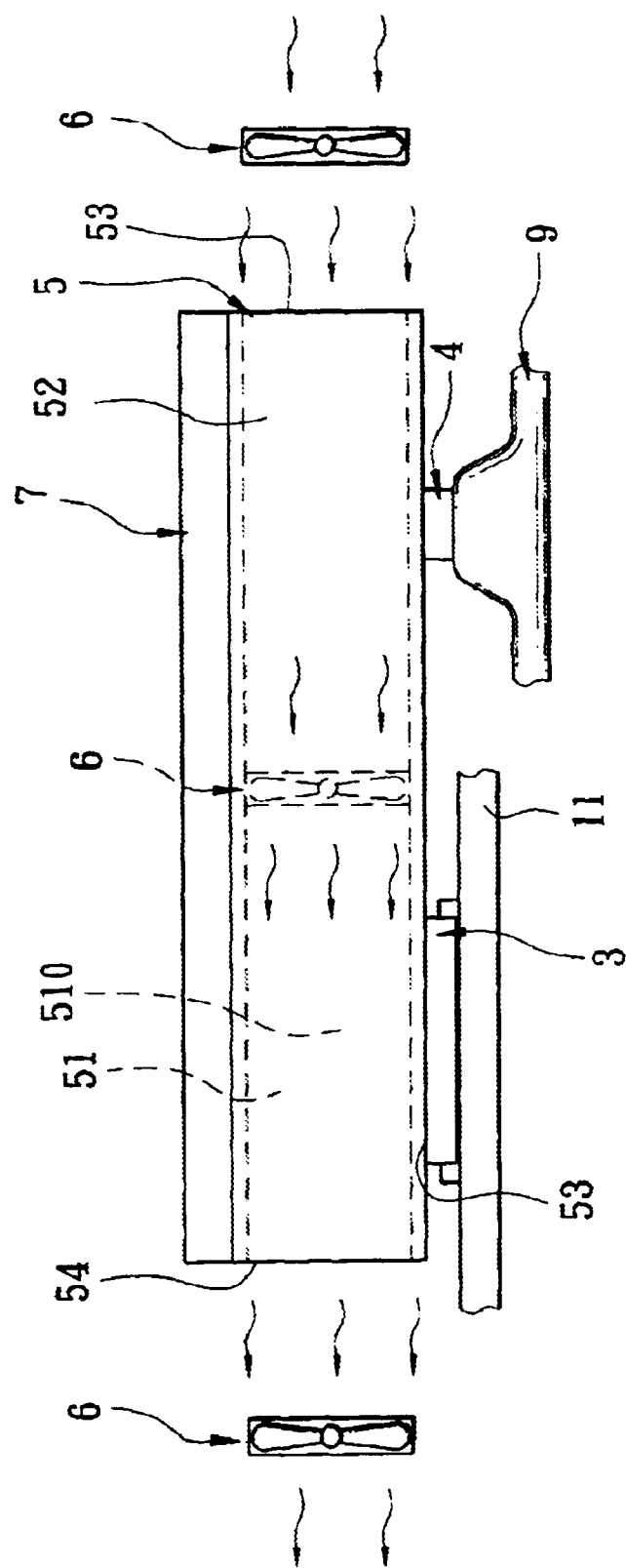
FIG. 2 is a schematic side view of the first preferred embodiment of a heat-dissipating module according to the invention.
Figure 3:
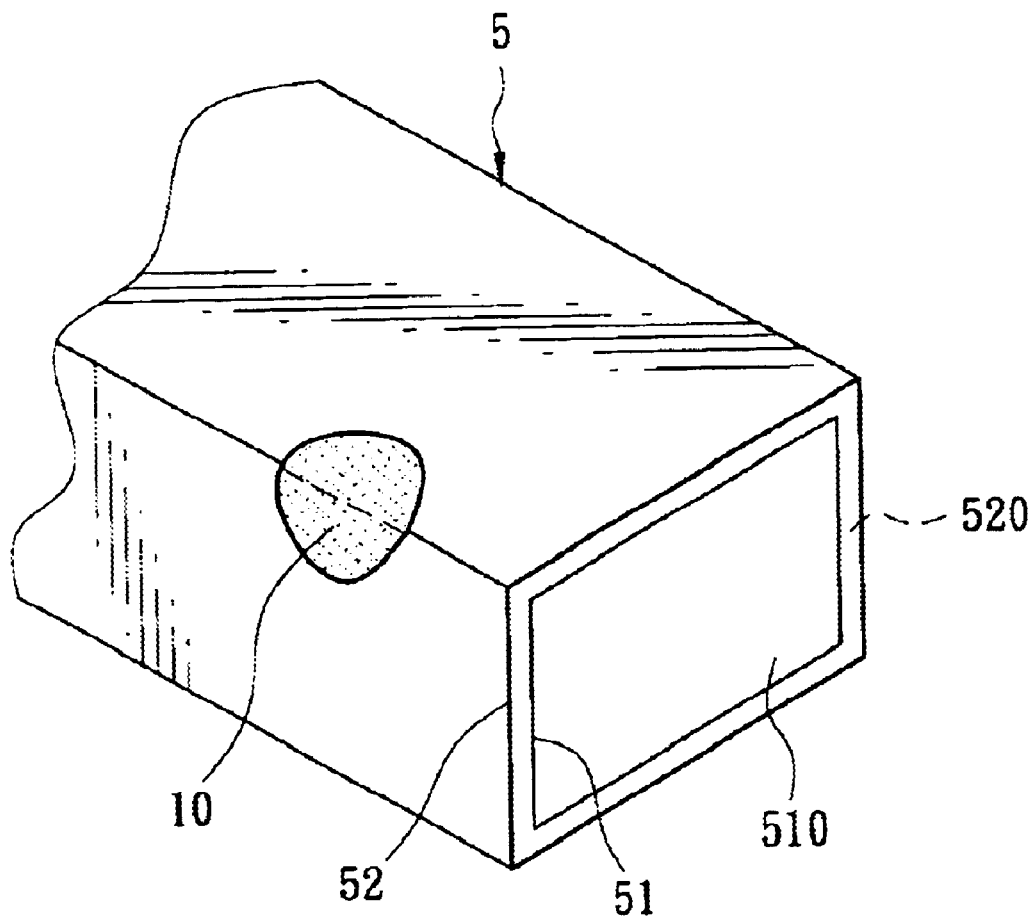
FIG. 3 is a fragmentary perspective view of a heat-conducting unit of the first preferred embodiment.

Referring to FIGS. 2 and 3, the first preferred embodiment of a heat dissipating module according to the present invention is shown to include a heat-conducting unit 5. The configuration of the heat-conducting unit 5 has been disclosed in the applicant's co-pending U.S. patent application Ser. No. 09/951,174, now U.S. Pat. No. 6,557,352, filed on Sep. 13, 2001. The contents of said application are incorporated herein by reference.

The heat-conducting unit 5 is adapted to be disposed on a heat-generating component 3 of an electronic device, such as a central processing unit or an integrated circuit of a computer. In this embodiment, the heat-generating component 3 is a central processing unit mounted on a circuit board 11. The heat-conducting unit 5 is formed by extrusion from a metal material, such as aluminum, copper, or alloys thereof, or a material with good heat conductivity, and includes a hollow inner tube 51 that is made of a heat-conducting material and that confines a first chamber 510, and a hollow outer tube 52 that is made of a heat-conducting material, that is disposed concentrically around the inner tube 51, and that cooperates with the inner tube 51 to form a second chamber 520. The outer tube 52 further has an outer planar surface 53 adapted to be disposed in close contact with the heat-generating component 3 so that heat generated by the heat-generating component 3 is transferred to the heat-conducting unit 5. The first chamber 510 has two open ends 53, 54, and permits passage of air therethrough. The second chamber 520 has two closed ends, and is filled with a thermal superconductor material 10 that can adhere to the inner and outer tubes 51, 52 in the vacuum interior of the second chamber 520, so that heat transferred from the heat-generating component 3 can quickly distribute all over the surfaces of the inner and outer tubes 51, 52 to bring the surface temperature of the heat-generating component 3 in accord with that of the heat-conducting unit 5. The thermal superconductor material 10 is preferably formed from inorganic elements to inhibit generation of oxygen and hydrogen molecules to thereby avoid danger of explosion, and is a non-radioactive material. In addition, the thermal superconductor material 10 has an applicable temperature range from about −50° C. to 1700° C.

A fan unit 6 is disposed to generate currents of air through the first chamber 510 so as to carry away the heat transferred to the heat-conducting unit 5 from the heat-generating component 3. The fan unit 6 can be disposed within the first chamber 510 and/or externally of the heat-conducting unit 5. In the embodiment shown in FIG. 2, the fan unit 6 includes a fan mounted within the inner tube 51, and two fans disposed proximate to the open ends 53, 54, respectively, to dissipate the heat upstream and downstream of the heat-conducting unit 5.

Furthermore, a heat-dissipating member 7 is disposed on the outer tube 52 of the heat-conducting unit 5. The heat-dissipating member 7 can be a metal plate forming a part of a housing panel of the computer (not shown) or a known heat-conducting pipe, which is disposed on one side of the outer tube 52 so as to provide an enhanced heat-dissipating effect.

In addition, a thermoelectric cooling unit 4 can be mounted on the outer tube 52 of the heat-conducting unit 5 and is adapted to be connected to a metal housing 9 of the computer so as to help lower the temperature of the heat-conducting unit 5.

In use, since the heat-conducting unit 5 having the thermal superconductor material 10 disposed therein has a very high temperature coefficient of conductivity, the heat generated by the heat-generating component 3 can be quickly transferred to the heat-conducting unit 5 for dissipation with the aid of the fan unit 6, the heat-dissipating member 7, and the thermoelectric cooling unit 4.

Figure 4:
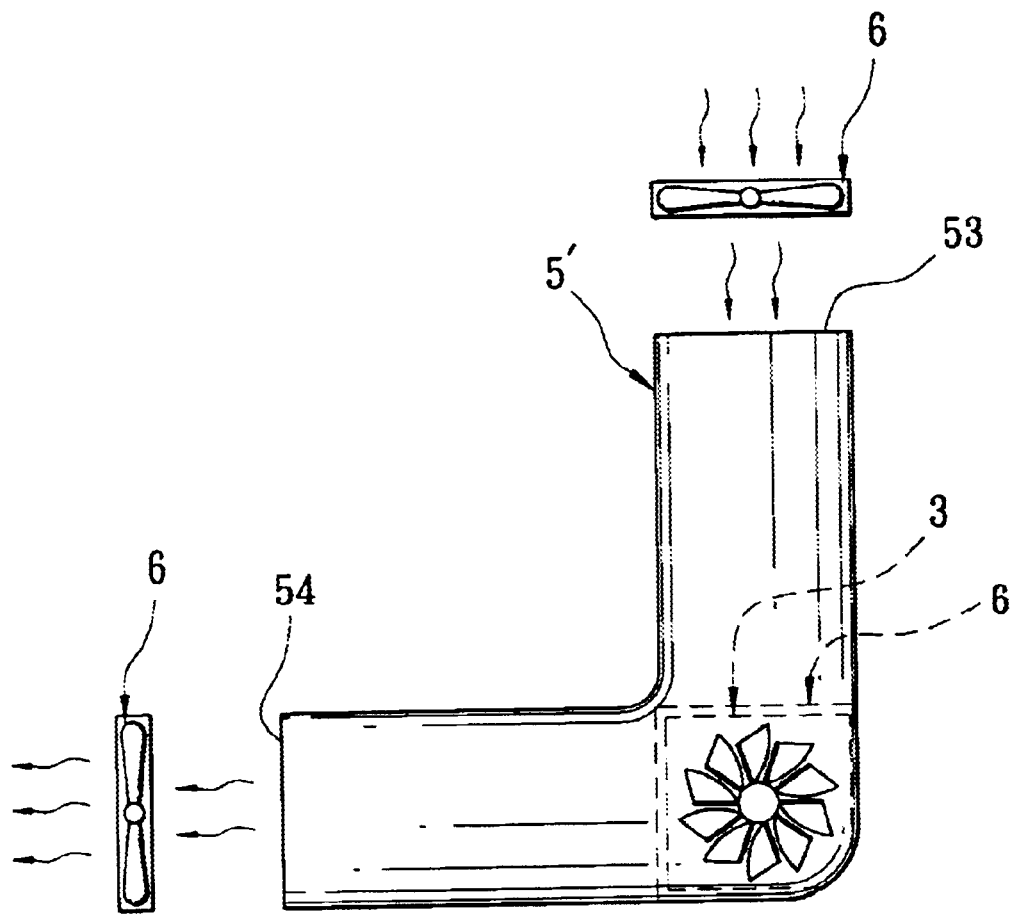
FIG. 4 is a schematic side view of the second preferred embodiment of a heat-dissipating module according to the invention.

FIG. 4 illustrates the second preferred embodiment of a heat-dissipating module according to the invention. This embodiment is substantially the same as the previous embodiment, the main difference therebetween residing in that the heat-conducting unit 5' has a substantially L-shaped configuration.

Figure 5:
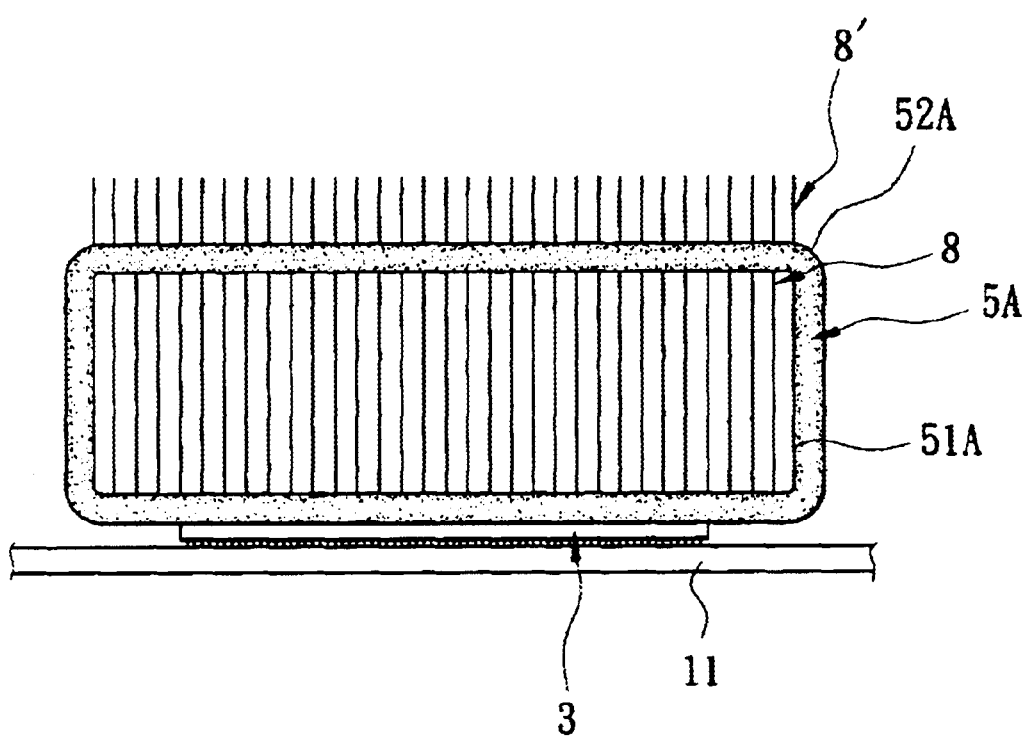
FIG. 5 is a sectional view of the third preferred embodiment of a heat-dissipating module according to the invention.

FIG. 5 illustrates the third preferred embodiment of a heat-dissipating module according to the invention. In this embodiment, a plurality of heat-dissipating fins 8 are disposed vertically within an inner tube 51A of a heat-conducting unit 5A that is adapted to be disposed in close contact with the heat-generating component 3 mounted on the circuit board 11. Each of the fins 8 has opposing ends that are connected to opposite inner wall surfaces of the inner tube 51A so as to enhance the heat-dissipating effect. In addition, heat-dissipating fins 8' are also provided to extend uprightly from an outer wall surface of an outer tube 52A of the heat-conducting unit 5A so as to obtain an increased heat-dissipating area.

Figure 6:
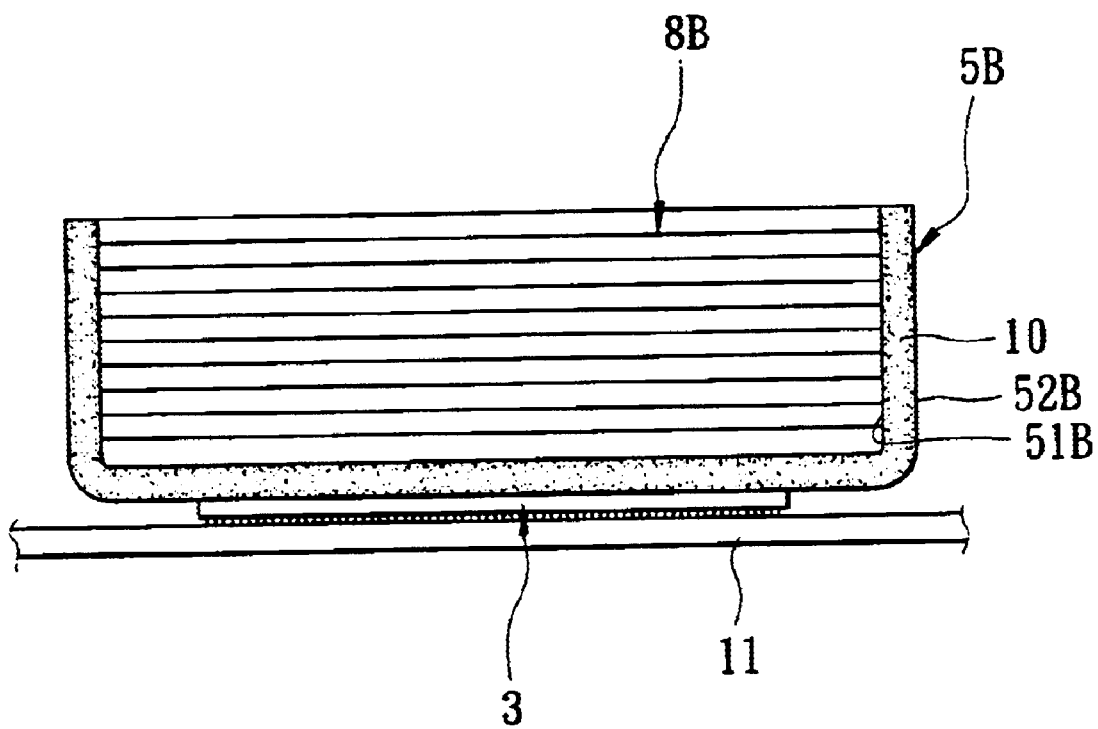
FIG. 6 is a sectional view of the fourth preferred embodiment of a heat-dissipating module according to the invention.

FIG. 6 illustrates the fourth preferred embodiment of a heat-dissipating module according to the invention. In this embodiment, a heat-conducting unit 5B is configured as a generally U-shaped hollow tubular member that has inner and outer walls 51B, 52B opposite to each other, and that includes a horizontal portion adapted to be disposed in close contact with the heat-generating component 3 mounted on the circuit board 11, and two upright portions opposite to each other. The inner and outer walls 51B, 52B confine an enclosed chamber filled with the thermal superconductor material 10. A plurality of heat-dissipating fins 8B extend transversely between the upright portions such that each of the fins 8B has opposing ends connected to the inner wall 51B of the heat-conducting unit 5B.

Figure 7:
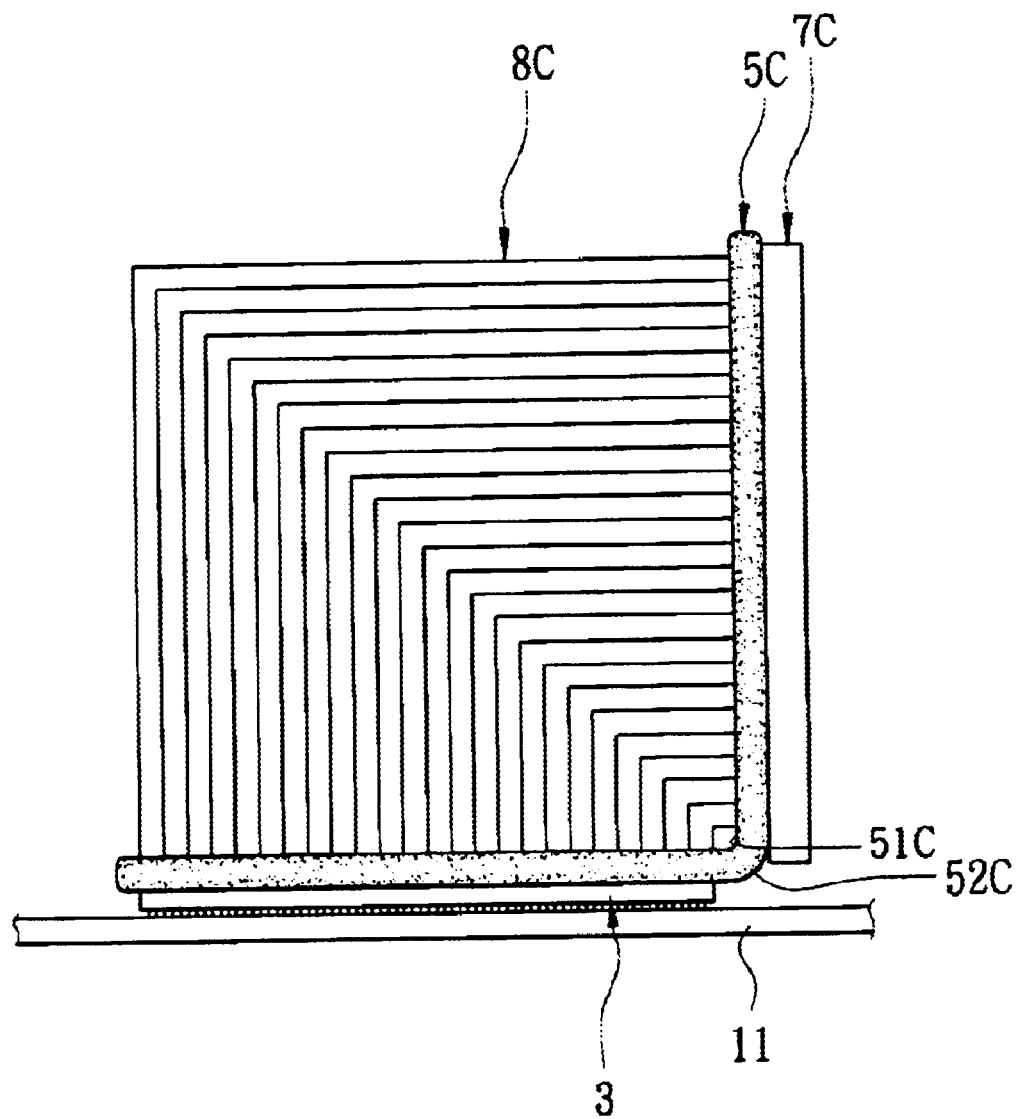
FIG. 7 is a partly sectional view of the fifth preferred embodiment of a heat-dissipating module according to the invention.

FIG. 7 shows the fifth preferred embodiment of a heat-dissipating module according to the invention. This embodiment is substantially similar to the fourth preferred embodiment. The major differences between this embodiment and the fourth preferred embodiment reside in that a heat-dissipating unit 5C is a generally L-shaped tubular member that includes a horizontal portion and a vertical portion, and that a plurality of L-shaped heat-dissipating fins 8C are provided to extend from the horizontal portion to the vertical portion such that each of the fins 8C has distal ends connected to an inner wall 51C of the heat-conducting unit 5C. In addition, a heat-dissipating member 7C is disposed on an outer wall 52C of the heat-conducting unit 5C.

Figure 8:
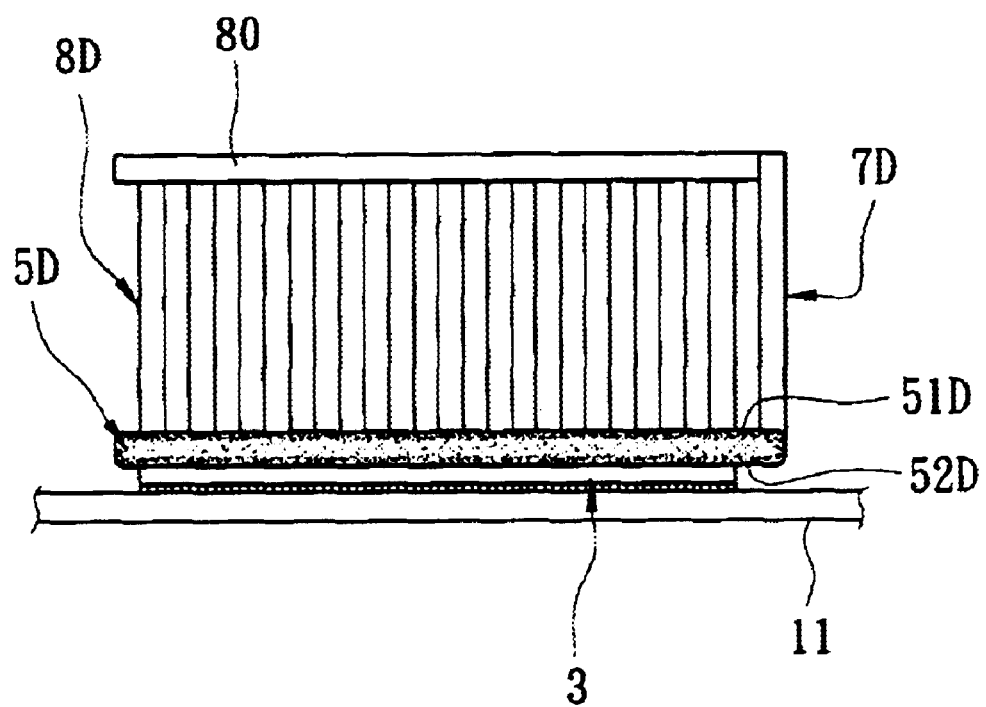
FIG. 8 is a partly sectional view of the sixth preferred embodiment of a heat-dissipating module according to the invention.

FIG. 8 shows the sixth preferred embodiment of a heat-dissipating module according to the invention. In this embodiment, a heat-dissipating unit 5D has a planar outer wall 52D adapted to be disposed in close contact with the heat-generating component 3 mounted on the circuit board 11, and a planar inner wall 51D opposite to the outer wall 52D. A heat-dissipating fin unit 8D extends uprightly from the inner wall 51D, and terminates at an aluminum connecting surface 80, which is provided to increase the heat-dissipating area. In addition, a heat-dissipating member 7D is disposed to extend uprightly from the heat-conducting unit 5D to the aluminum connecting surface 80 so as to further enhance the heat-dissipating effect.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. An above ground pool comprising:
   a pool body formed from a unitary sheet of pliable water-impermeable material and having a bottom wall and a surrounding wall that extends upwardly and integrally from a periphery of said bottom wall, that has a distal top edge distal to said bottom wall, and that further has a diameter that decreases gradually in a direction from said periphery of said bottom wall to said distal top edge of said surrounding wall;
   an air inflatable ring member having an upper ring part, a lower ring part that is connected integrally to said distal top edge of said surrounding wall, and a central ring axis; and a reinforcing member mounted in said ring member to ensure that said central ring axis is generally concentric with and does not extend outside a circular area bounded by said distal top edge of said surrounding wall, said reinforcing member including an annular strip bonded to and extending along said ring member, wherein said annular strip is bonded to and extends along said upper ring part of said ring member.

2. The heat-dissipating module as claimed in claim 1, wherein said fan unit is disposed within said first chamber.

3. The heat-dissipating module as claimed in claim 1, wherein said fan unit is disposed externally of said heat-conducting unit.

4. The heat-dissipating module as claimed in claim 1, further comprising a heat-dissipating member disposed on said outer tube of said heat-conducting unit.

5. The heat-dissipating module as claimed in claim 4, wherein said heat-dissipating member is a metal plate.

6. The heat-dissipating module as claimed in claim 4, wherein said heat-dissipating member is a heat-conducting pipe.

7. The heat-dissipating module as claimed in claim 1, further comprising a thermoelectric cooling unit mounted on said outer tube of said heat-conducting unit.

8. The heat-dissipating module as claimed in claim 1, further comprising a plurality of heat-dissipating fins, each of which has opposing ends connected to an inner wall surface of said inner tube.

9. The heat-dissipating module as claimed in claim 1, further comprising a plurality of heat-dissipating fins extending from an outer wall surface of said outer tube.

* * * * *

UNITED STATES PATENT AND TRADEMARK OFFICE
CERTIFICATE OF CORRECTION

| | | |
|---|---|---|
| PATENT NO. | : 6,711,018 B2 | Page 1 of 1 |
| APPLICATION NO. | : 10/150298 | |
| DATED | : March 23, 2004 | |
| INVENTOR(S) | : Chin-Kuang Luo | |

It is certified that error appears in the above-identified patent and that said Letters Patent is hereby corrected as shown below:

Column 4:

Delete lines 55-68 and insert the following:

--1. A heat-dissipating module comprising:
a heat-conducting unit adapted to be disposed on a heat-generating component of an electronic device, said heat-conducting unit including a hollow inner tube that is made of a heat-conducting material and that confines a first chamber, and a hollow outer tube that is made of a heat-conducting material, that is disposed concentrically around said inner tube, and that cooperates with said inner tube to form a second chamber said first chamber permitting passage of air therethrough, said second chamber having two closed ends and being filled with a thermal superconductor material, said outer tube having an outer planar surface adapted to be disposed in close contact with the heat-generating component so that heat generated by the heat-generating component is transferred to said heat-conducting unit; and
a fan unit disposed to generate a current of air through said first chamber so as to carry away the heat transferred to said heat-conducting unit.--

Column 5:

Delete lines 1-8.

Signed and Sealed this

Seventh Day of November, 2006

JON W. DUDAS
*Director of the United States Patent and Trademark Office*